(12) United States Patent
Muramoto et al.

(10) Patent No.: US 11,777,051 B2
(45) Date of Patent: Oct. 3, 2023

(54) METHOD OF MANUFACTURING LIGHT-EMITTING ELEMENT

(71) Applicant: NICHIA CORPORATION, Anan (JP)

(72) Inventors: Eiji Muramoto, Tokushima (JP); Maki Fujimoto, Anan (JP)

(73) Assignee: NICHIA CORPORATION, Anan (JP)

( * ) Notice: Subject to any disclaimer, the term of this patent is extended or adjusted under 35 U.S.C. 154(b) by 283 days.

(21) Appl. No.: 17/361,803

(22) Filed: Jun. 29, 2021

(65) Prior Publication Data

US 2021/0408322 A1 Dec. 30, 2021

(30) Foreign Application Priority Data

Jun. 30, 2020 (JP) .................................. 2020-112705

(51) Int. Cl.
*H01L 33/00* (2010.01)
*H01L 33/32* (2010.01)

(52) U.S. Cl.
CPC ............ *H01L 33/007* (2013.01); *H01L 33/32* (2013.01)

(58) Field of Classification Search
None
See application file for complete search history.

(56) References Cited

U.S. PATENT DOCUMENTS

| | | | |
|---|---|---|---|
| 2003/0169794 A1 | 9/2003 | Hatano et al. | |
| 2009/0239324 A1 | 9/2009 | Chinone et al. | |
| 2011/0031589 A1* | 2/2011 | Ishibashi | H01L 29/2003 257/E29.089 |
| 2012/0252213 A1 | 10/2012 | Singh et al. | |
| 2013/0328334 A1* | 12/2013 | Hoiss | B60R 19/24 293/154 |
| 2014/0353582 A1 | 12/2014 | Kim et al. | |
| 2017/0301772 A1* | 10/2017 | Radway | H01L 21/30604 |
| 2019/0051516 A1* | 2/2019 | Lee | H01L 21/0254 |

FOREIGN PATENT DOCUMENTS

| | | |
|---|---|---|
| JP | 2003-332688 A | 11/2003 |
| JP | 2014-116439 A | 6/2014 |
| JP | 2014-522098 A | 8/2014 |
| JP | 2015-509663 A | 3/2015 |
| WO | WO-2006/104063 A1 | 10/2006 |
| WO | WO-2018/235231 A1 | 12/2018 |

\* cited by examiner

*Primary Examiner* — Bradley Smith
(74) *Attorney, Agent, or Firm* — Foley & Lardner LLP (57) ABSTRACT

A method of manufacturing a light-emitting element includes: providing a semiconductor structure including: a first layer containing gallium and nitrogen, a second layer of a first conductive type, the second layer containing gallium, aluminum, and nitrogen and being located on or above the first layer, an active layer located on or above the second layer, and a third layer of a second conductive type, the third layer located on or above the active layer, wherein a thickness of the first layer is larger than a thickness of the second layer; performing chemical-mechanical polishing from a first layer side to reduce the thickness of the first layer; and performing dry etching from the first layer side to remove the first layer and reduce the thickness of the second layer.

20 Claims, 9 Drawing Sheets

METHOD OF MANUFACTURING LIGHT-EMITTING ELEMENT

CROSS-REFERENCE TO RELATED APPLICATION

This application claims priority to Japanese Patent Application No. 2020-112705, filed on Jun. 30, 2020, the disclosure of which is hereby incorporated by reference in its entirety.

BACKGROUND

The present disclosure relates to a method of manufacturing a light-emitting element.

A semiconductor layer constituting a light-emitting element is formed by, for example, epitaxial growth on a sapphire substrate. PCT Publication No. WO2006/104063 discloses that a substrate is removed from a semiconductor layer and that the semiconductor layer exposed from the substrate is then partially removed.

SUMMARY

In the case in which the thickness of a semiconductor layer is reduced to a desired thickness, the thickness of the semiconductor layer is required to be precisely reduced to the desired thickness in order to improve yield. Certain embodiments of the present disclosure provide a method of manufacturing a light-emitting element that can improve yield.

According to one embodiment, a method of manufacturing a light-emitting element includes: providing a semiconductor structure including a first layer containing gallium and nitrogen, a second layer of a first conductive type containing gallium, aluminum, and nitrogen and lying on or above the first layer, an active layer on or above the second layer, and a third layer of a second conductive type on or above the active layer; performing chemical-mechanical polishing from a first layer side to reduce a thickness of the first layer; and performing dry etching from the first layer side to remove the first layer and reduce a thickness of the second layer. Before the step of performing chemical-mechanical polishing, the thickness of the first layer is larger than the thickness of the second layer.

A method of manufacturing a light-emitting element according to certain embodiments of the present disclosure can improve yield.

DETAILED DESCRIPTION

Embodiment

A method of manufacturing a light-emitting element according to an embodiment is described below.

Figure 1:
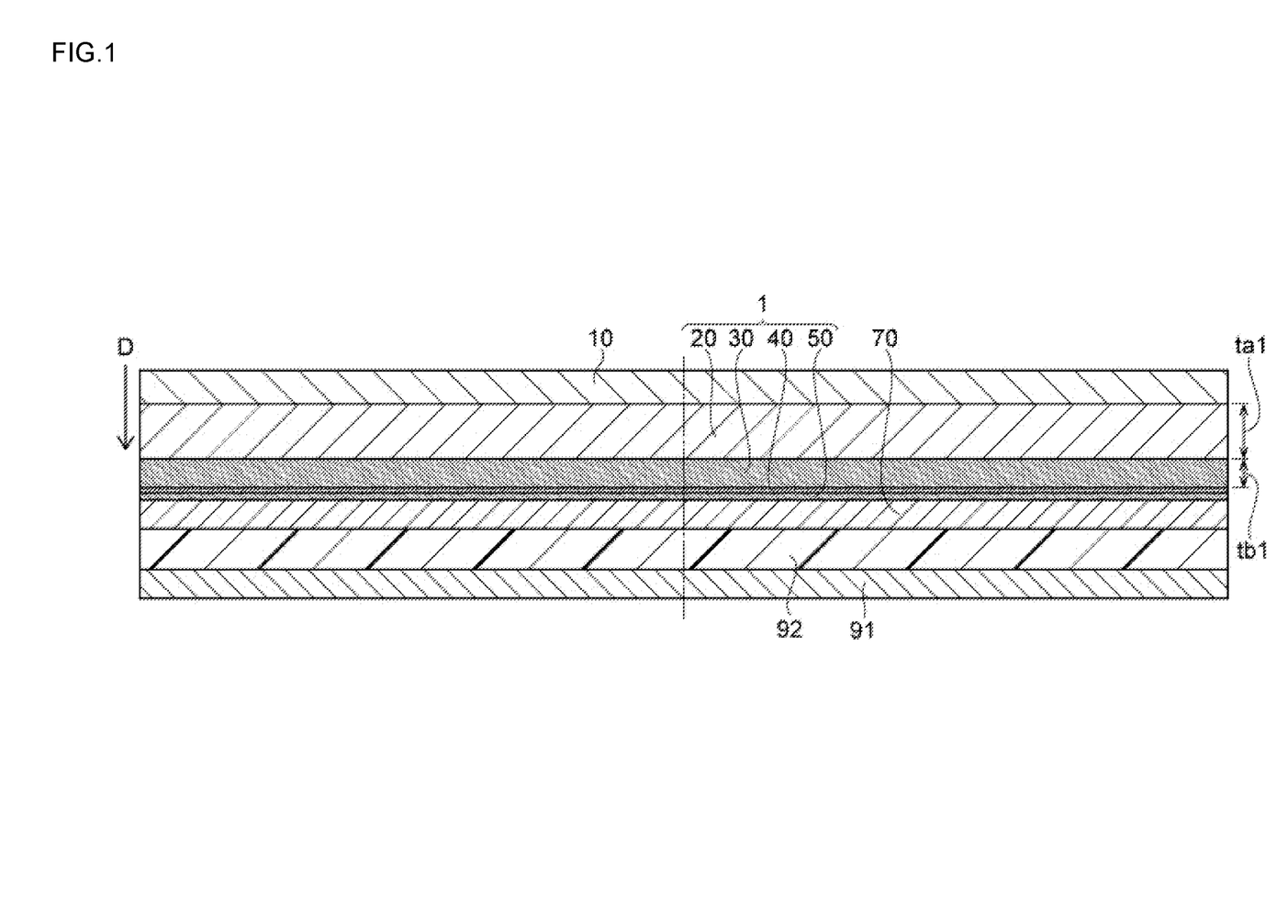
FIG. 1 is a schematic cross-sectional view illustrating a method of manufacturing a light-emitting element according to an embodiment of the present disclosure.

FIG. 1 is a schematic cross-sectional view illustrating the method of manufacturing a light-emitting element according to the present embodiment.

Figure 2:
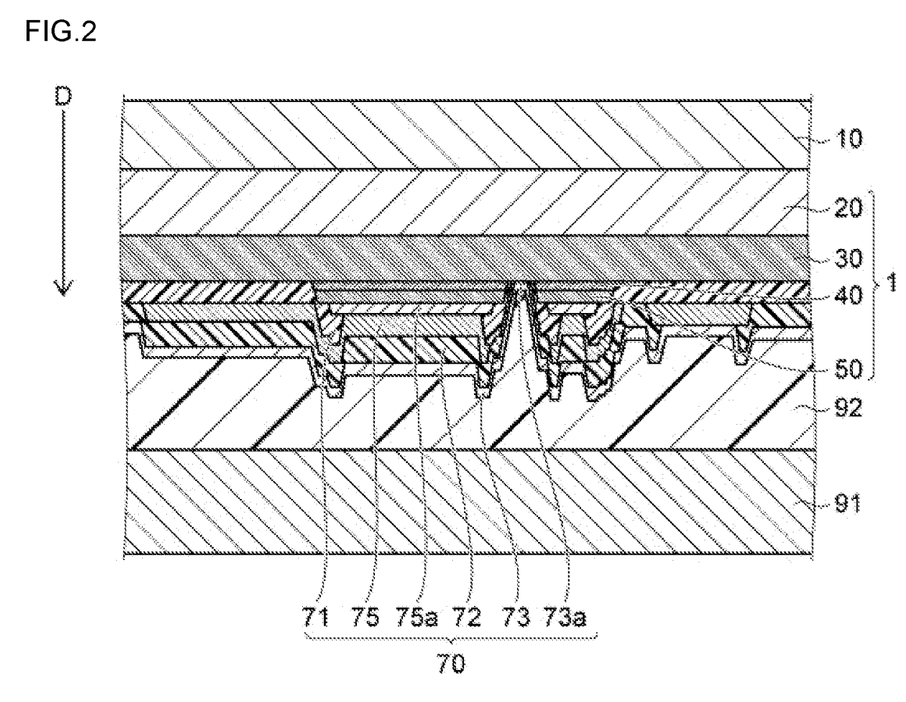
FIG. 2 is a schematic enlarged cross-sectional view of a region in which a single light-emitting element is to be formed in FIG. 1.

FIG. 2 is a schematic enlarged cross-sectional view of a region in which a single light-emitting element is to be formed in FIG. 1.

Figure 3:
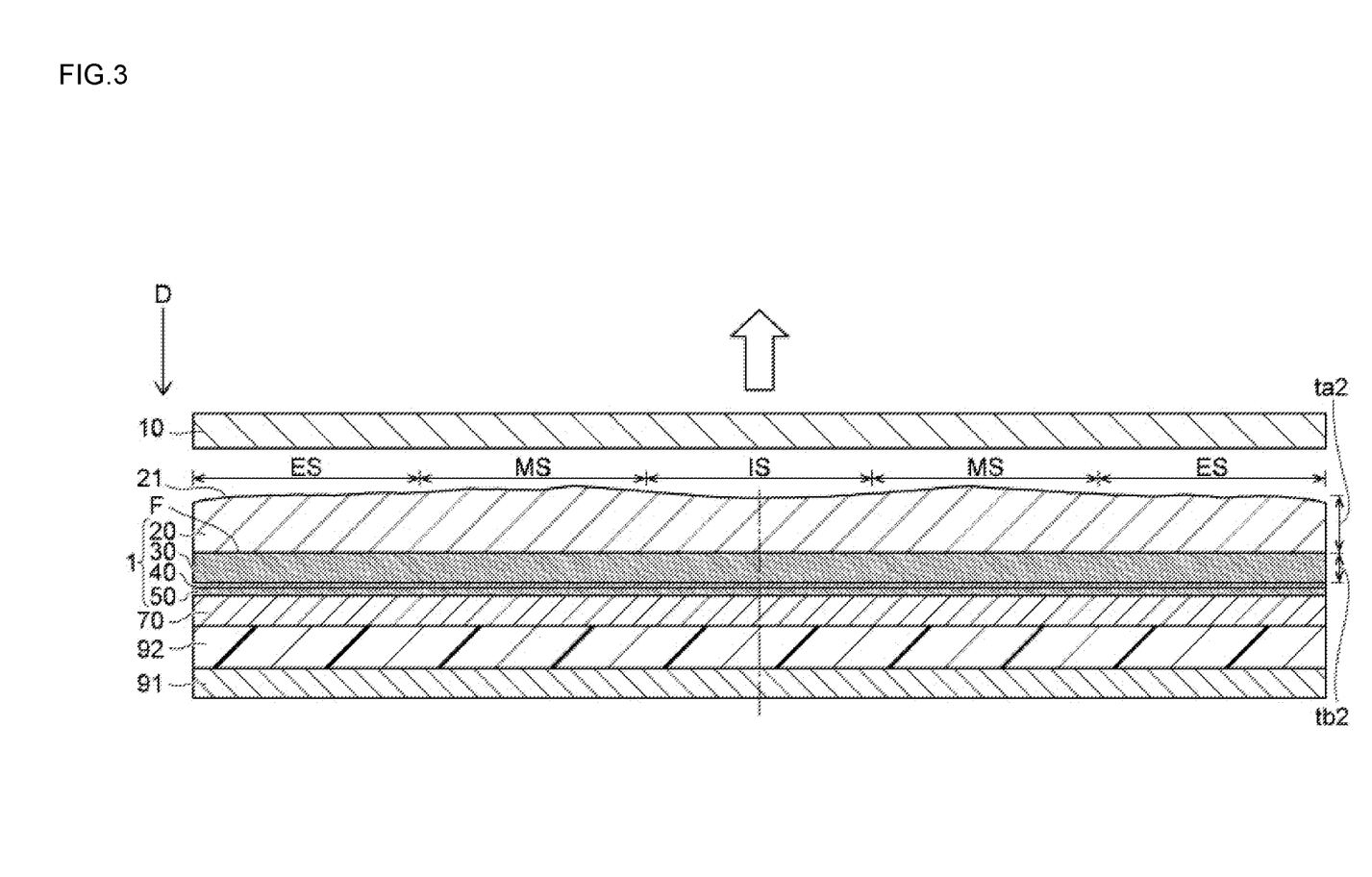
FIG. 3 is a schematic cross-sectional view illustrating the method of manufacturing a light-emitting element according to the embodiment of the present disclosure.

FIG. 3 is a schematic cross-sectional view illustrating the method of manufacturing a light-emitting element according to the present embodiment.

Figure 4:
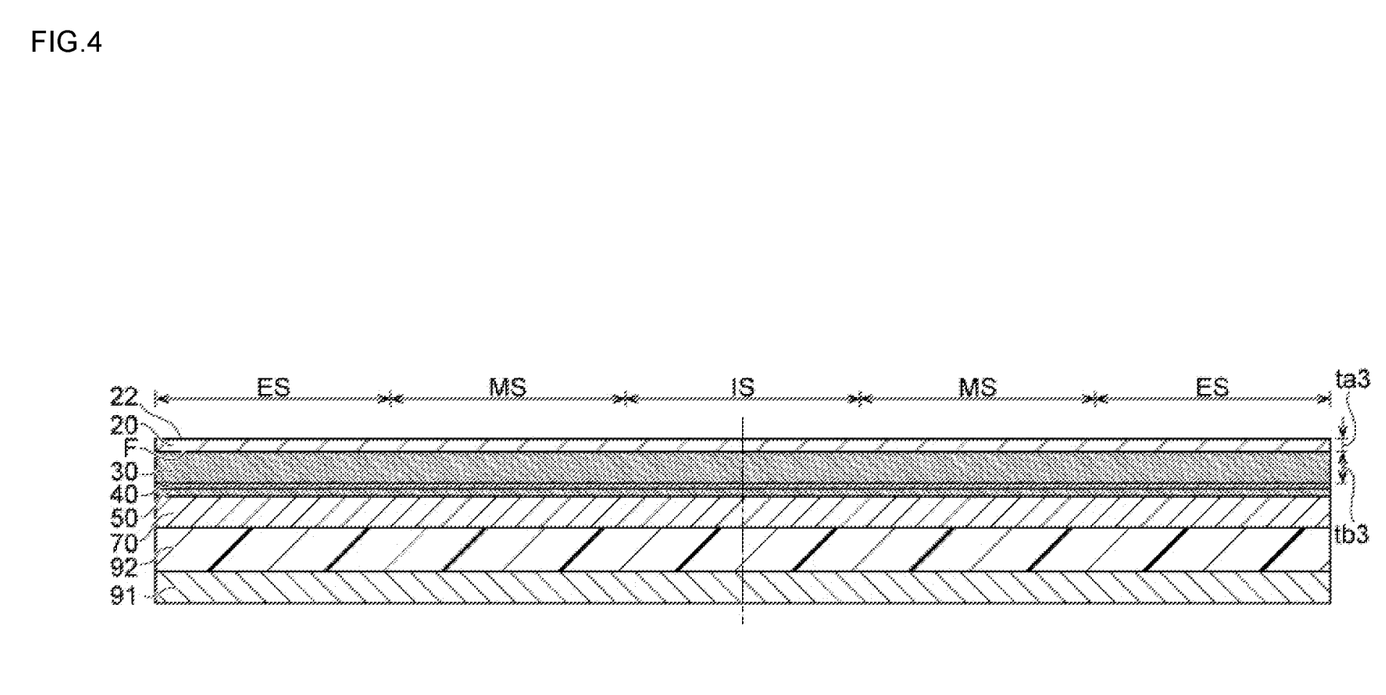
FIG. 4 is a schematic cross-sectional view illustrating the method of manufacturing a light-emitting element according to the embodiment of the present disclosure.

FIG. 4 is a schematic cross-sectional view illustrating the method of manufacturing a light-emitting element according to the present embodiment.

Figure 5:
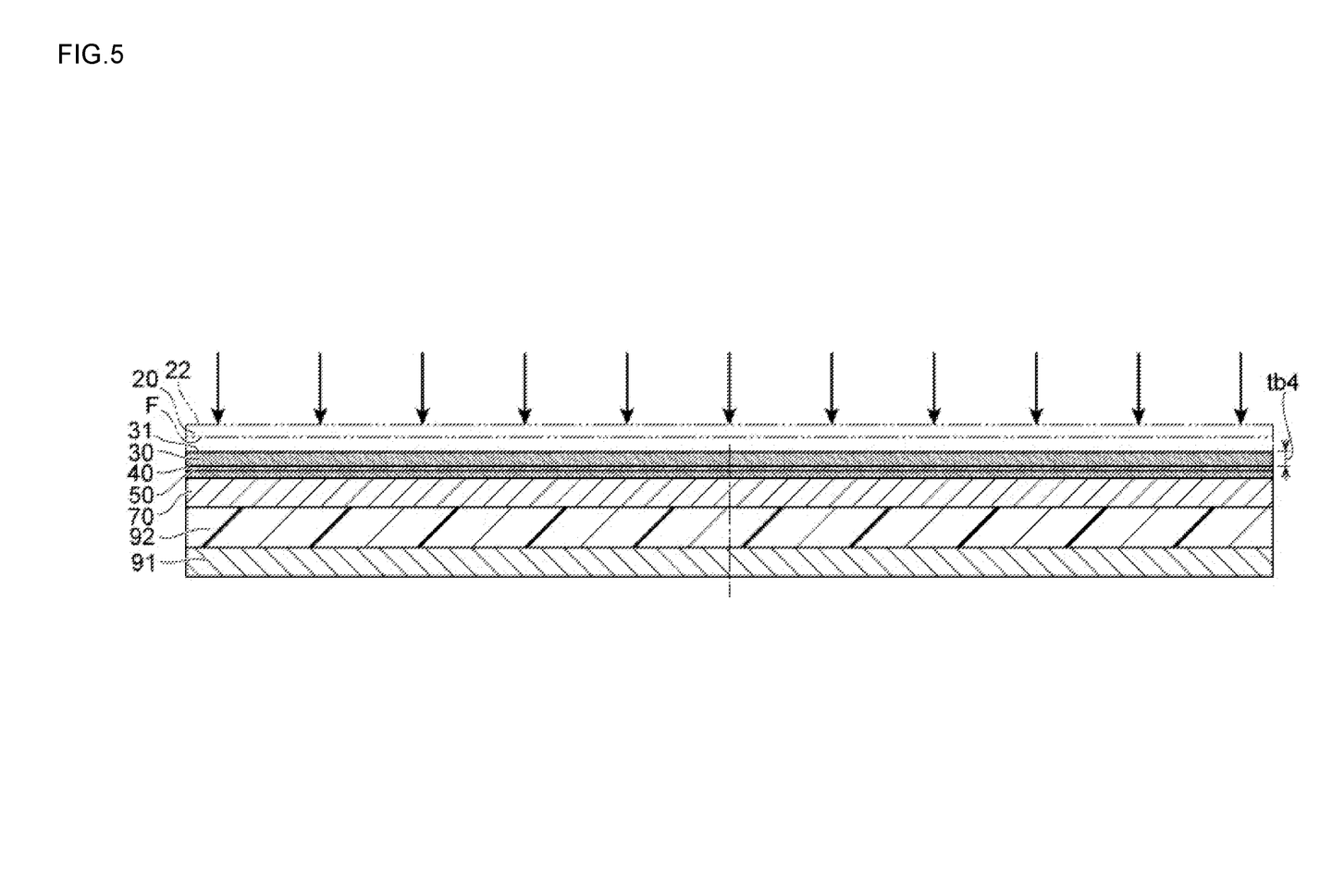
FIG. 5 is a schematic cross-sectional view illustrating the method of manufacturing a light-emitting element according to the embodiment of the present disclosure.

FIG. 5 is a schematic cross-sectional view illustrating the method of manufacturing a light-emitting element according to the present embodiment.

Figure 6:
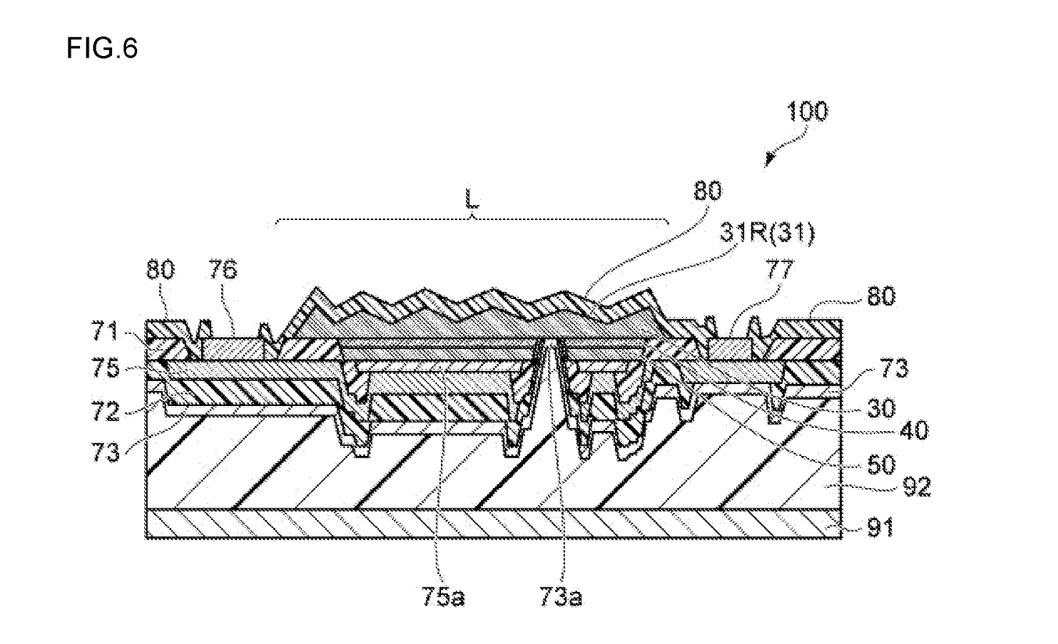
FIG. 6 is a schematic cross-sectional view of the light-emitting element in the embodiment of the present disclosure.

FIG. 6 is a schematic cross-sectional view of the light-emitting element in the present embodiment.

The drawings are schematic or conceptual, and the relationship between the thickness and the width of each component, the ratio between the sizes of components, and other relationships are not necessarily the same as those of an actual product. In particular, FIG. 1 and FIG. 3 to FIG. 5 are schematic views in which the scale in the diameter direction of a semiconductor structure 1 is relatively reduced, and in which the scale in the thickness direction is relatively enlarged. The sizes and ratios of the same component in different drawings may be different from each other. In the specification and the drawings, an element that is the same as that described in a drawing that has been previously referred to is indicated with the same reference numeral, and its detailed description is omitted as appropriate.

Providing Semiconductor Structure 1

The semiconductor structure 1 is first provided.

As shown in FIG. 1, the semiconductor structure 1 includes a first layer 20, a second layer 30 on the first layer 20, an active layer 40 on the second layer 30, and a third layer 50 on the active layer 40. The direction of an arrow D directed from a substrate 10 to the first layer 20 as shown in FIG. 1 is referred to as the "upper/above" direction in the step of providing the semiconductor structure 1.

The semiconductor structure 1 may be provided by manufacturing or purchasing a semiconductor structure 1 from someone else. In the present embodiment, an example in which the semiconductor structure 1 is provided by manufacturing is described.

The step of providing the semiconductor structure 1 includes forming the first layer 20, the second layer 30, the active layer 40, and the third layer 50 on the substrate 10 and removing the substrate 10 from the first layer 20.

Forming First Layer 20, Second Layer 30, Active Layer 40, and Third Layer 50 on Substrate 10

The substrate 10 is first provided, and the first layer 20, the second layer 30, the active layer 40, and the third layer 50 are grown on the substrate 10.

This step is described below in detail.

The substrate 10 is, for example, a wafer made of single crystal sapphire. The diameter of the substrate 10 is, for example, about 100 mm. The substrate 10 may be a substrate made of silicon.

Subsequently, for example, the first layer 20 is epitaxially grown on the substrate 10.

The first layer 20 contains gallium (Ga) and nitrogen (N). For example, the first layer 20 contains gallium nitride (GaN). The first layer 20 may contain aluminum (Al) in addition to gallium and nitrogen. A thickness ta1 of the first layer 20 can be, for example, 5 μm or more and 15 μm or less. The thickness ta1 of the first layer 20 is, for example, 6.5 μm.

Subsequently, for example, the second layer 30 is epitaxially grown on the first layer 20.

The second layer 30 is made of a semiconductor material of a first conductive type containing gallium, aluminum, and nitrogen. For example, the second layer 30 is made of an n-type semiconductor material containing aluminum gallium nitride (AlGaN). The general formula of the second layer 30 is, for example, $Al_XGa_{1-x}N$ (where 0<X<1). A mixing ratio X of aluminum in the second layer 30 is, for example, 0.02 or more and 0.1 or less. The second layer 30 may contain indium (In) in addition to gallium, aluminum, and nitrogen.

A thickness tb1 of the second layer 30 is smaller than the thickness ta1 of the first layer 20. The thickness tb1 of the second layer 30 can be, for example, 1 μm or more and 3 μm or less. The thickness tb1 of the second layer 30 is, for example, 2.0 μm.

Another layer may be formed between the first layer 20 and the second layer 30. The other layer is, for example, a layer containing aluminum nitride.

Subsequently, the active layer 40 is grown on the second layer 30, and the third layer 50 is grown on the active layer 40. The third layer 50 is made of a semiconductor material of a second conductive type, such as a p-type semiconductor material.

Subsequently, a wiring layered body 70 is formed on the semiconductor structure 1.

As shown in FIG. 2, the wiring layered body 70 includes a second contact 73a and a second wiring layer 73 connected to the second layer 30, a third electrode 75a and a third wiring layer 75 connected to the third layer 50, and a first insulating film 71 and a second insulating film 72 insulating these components.

Subsequently, a supporting substrate 91 is provided, and a bonding layer 92 is formed on the supporting substrate 91. The supporting substrate 91 is, for example, a substrate made of silicon. The bonding layer 92 is bonded to the wiring layered body 70. The substrate 10, the semiconductor structure 1, the wiring layered body 70, the bonding layer 92, and the supporting substrate 91 are thus layered as shown in FIG. 1 and FIG. 2.

Removing Substrate 10 from First Layer 20

Subsequently, the substrate 10 is removed from the first layer 20.

By detaching the substrate 10 from the first layer 20, for example, using laser lift off (LLO), the substrate 10 is removed. By the removal of the substrate 10, the semiconductor structure 1 in which the third layer 50, the active layer 40, the second layer 30, and the first layer 20 are layered in the order from the supporting substrate 91 side is formed on the supporting substrate 91.

As shown in FIG. 3, a separated surface 21 is exposed from the substrate 10 on the lower surface of the first layer 20 after the substrate 10 is removed. For example, the separated surface 21 may have irregularities because the semiconductor structure 1 is partially melted and roughened by heat due to laser lift off. As shown in FIG. 3, for example, the first layer 20 has a thickness smaller in an edge region ES and a central region IS than a thickness of the first layer 20 in an intermediate region MS. The edge region ES is a region of the semiconductor structure 1 located near the edge of the semiconductor structure 1. The central region IS is a region of the semiconductor structure 1 located at the center of the semiconductor structure 1. The intermediate region MS is a region of the semiconductor structure 1 located between the edge region ES and the central region IS. As described above, the first layer 20 has variations in the thickness after the substrate 10 is removed. The average of a thickness ta2 of the first layer 20 after the substrate 10 is removed is, for example, 5 μm or more and 15 μm or less. The average in the plane of the thickness ta2 of the first layer 20 after the substrate 10 is removed is, for example, 6.5 μm. A thickness tb2 of the second layer 30 after the substrate 10 is removed is, for example, 2.0 μm, which is not different from the thickness tb1 before the substrate 10 is removed.

Performing Chemical-mechanical Polishing

Subsequently, chemical-mechanical polishing (CMP) is performed from the first layer 20 side to reduce the thickness of the first layer 20.

Before the step of performing CMP, the first layer 20 has the thickness ta2 larger than the thickness tb2 of the second layer 30 as shown in FIG. 3. CMP is performed from the separated surface 21 side of the first layer 20.

In chemical-mechanical polishing, for example, the semiconductor structure 1 is fixed to an end of a rotating carrier. The separated surface 21 of the first layer 20 is then pushed against a rotating polishing pad, and, while a chemical polishing agent is dropped, the separated surface 21 is polished by the combined effects of chemical action and mechanical polishing. By performing CMP on the separated surface 21 of the first layer 20, a polished surface 22 of the first layer 20 is formed. For example, a pushing force applied to an intermediate region MS is preferably stronger than in the case of the edge region ES and the central region IS at the time of polishing. In such polishing, polishing of the intermediate region MS, which has a thickness larger than the thicknesses in the edge region ES and the central region IS, is selectively advanced, so that the polished surface 22 can be made close to a flat surface as shown in FIG. 4. By performing CMP on the separated surface 21 of the first layer 20, the polished surface 22 can be flattened, which allows the first layer 20 to have more uniform thickness.

On the other hand, in the case in which chemical-mechanical polishing is performed under the same conditions, the polishing rate varies according to the substance to be polished. The polishing rate is the thickness of the semiconductor layer removed by polishing per unit time. The polishing rate of the first layer 20 by chemical-mechanical polishing is, for example, P1. On the other hand, supposing the second layer 30 is polished under the same conditions as in chemical-mechanical polishing of the first layer 20, a polishing rate P2 of the second layer 30 by chemical-mechanical polishing is higher than the polishing rate P1. That is, P2>P1. For example, the polishing rate P2 is 1.5 times or more and 3 times or less as high as the polishing rate P1.

As shown in FIG. 4, the step of performing chemical-mechanical polishing in the present embodiment is finished such that the first layer 20 having a certain thickness is left, and the second layer 30 is not polished. Accordingly, on the polished surface 22 formed by chemical-mechanical polishing, only the first layer 20 is exposed, while the second layer 30 is not exposed. Variations in the thickness of the first layer 20 having the polished surface 22 are smaller than variations in the thickness of the first layer 20 having the separated surface 21.

A thickness ta3 of the first layer 20 after chemical-mechanical polishing is, for example, 0.3 µm or more and 1 µm or less. The thickness ta3 of the first layer 20 is, for example, 0.8 The term "thickness ta3 of the first layer 20" refers to the average thickness in the plane of the first layer 20 after chemical-mechanical polishing. A thickness tb3 of the second layer 30 after chemical-mechanical polishing is, for example, 2.0 which is not different from the thickness of the second layer 30 before chemical-mechanical polishing. The thickness ta3 of the first layer 20 is therefore smaller than the thickness tb3 of the second layer 30 after chemical-mechanical polishing. In the present embodiment, for example, the thickness ta3 of the first layer 20 can be determined below. For example, in the case in which the diameter of the first layer 20 is about 100 mm, the center of the first layer 20 and points 8 mm, 16 mm, 24 mm, 32 mm, 38 mm, and 44 mm away from the center of the first layer 20 in the vertical and lateral directions in a plan view are measured. The average of the thicknesses at a total of 25 points measured is regarded as the average of the thickness ta3 of the first layer 20.

The thickness ta3 of the first layer 20 after the step of reducing the thickness of the first layer 20 is preferably, for example, 20% or less, more preferably 15% or less, of the thickness ta2 of the first layer 20 before the step of reducing the thickness of the first layer 20.

Performing Dry Etching

Subsequently, dry etching is performed from the first layer 20 side as shown in FIG. 5. This operation removes the first layer 20 and makes the second layer 30 have a small thickness.

Dry etching refers to, for example, reactive ion etching (RIE). Dry etching is performed using an etching gas containing chlorine (Cl), such as an etching gas containing a mixed gas ($SiCl_4+Cl_2$) of silicon tetrachloride gas and chlorine gas.

As shown in FIG. 4 and FIG. 5, dry etching is performed from the polished surface 22 side of the first layer 20. The first layer 20 and a portion of the second layer 30 are removed by dry etching from the polished surface 22 side, so that the second layer 30 is exposed from the first layer 20. In other words, dry etching is performed beyond an interface F between the first layer 20 and the second layer 30 to expose the second layer 30. An etched surface 31 of the second layer 30 is formed by dry etching. The etched surface 31 tends to be in substantially the same surface condition as of the polished surface 22. For example, if the polished surface 22 is flat, the etched surface 31 is also flat. The variations in the thickness of the first layer 20 having the polished surface 22 are reduced, which allows the second layer 30 to have a more uniform thickness after dry etching. A thickness tb4 of the second layer 30 after dry etching is, for example, 1 µm or more and 2.5 µm or less. The thickness tb4 of the second layer 30 after dry etching is, for example, 1.5 µm. The thickness of the first layer 20 is zero because the first layer 20 is removed. The term "thickness tb4 of the second layer 30" refers to the average thickness in the plane of the second layer 30 after dry etching. In the present embodiment, for example, the thickness tb4 of the second layer 30 can be determined below. For example, in the case in which the diameter of the second layer 30 is about 100 mm, the center of the second layer 30 and points 8 mm, 16 mm, 24 mm, 32 mm, 38 mm, and 44 mm away from the center of the second layer 30 in the vertical and lateral directions in a plan view are measured. The average of the thicknesses at a total of 25 points measured is regarded as the average of the thickness tb4 of the second layer 30.

The etch rate of the first layer 20 in the step of performing dry etching is indicated by E1, and the etch rate of the second layer 30 in the step of performing dry etching is indicated by E2. The etch rate is the thickness removed by etching per unit time. For example, the etching rate E1 of the first layer 20 is substantially equal to the etching rate E2 of the second layer 30. The statement "the etching rate E1 of the first layer 20 is substantially equal to the etching rate E2 of the second layer 30" indicates that the difference between the etching rate E1 of the first layer 20 and the etching rate E2 of the second layer 30 is 3% or less.

In the present embodiment, the polishing rates and the etch rates of the first layer 20 and the second layer 30 are set to satisfy the relations below. The value of the ratio (E2/E1) of the etching rate E2 of the second layer 30 to the etching rate E1 of the first layer 20 in the step of performing dry etching is smaller than the value of the ratio (P2/P1) of the polishing rate P2 of the second layer 30 by chemical-mechanical polishing to the polishing rate P1 of the first layer 20 in the step of performing chemical-mechanical polishing. That is, the rates are set to satisfy Formula (1) below.

$$(E2/E1)<(P2/P1) \tag{1}$$

For example, the value of the ratio (E2/E1) of the etching rate E2 to the etching rate E1 is 1, and the value of the ratio (P2/P1) of the polishing rate P2 to the polishing rate P1 is 2.

Subsequently, as shown in FIG. 6, the second layer 30, the active layer 40, and the third layer 50 are selectively removed by performing etching from the etched surface 31 side. A region in which the second layer 30 remains constitutes a semiconductor unit L. The semiconductor unit L is a region that includes the second layer 30, the active layer 40, and the third layer 50 layered on each other and that emits light because of the combination of electrons and holes released from the second layer 30 and the third layer 50 in the active layer 40. The etched surface 31 of the second layer 30 in the semiconductor unit L is roughened to form an irregular surface 31R.

Subsequently, a first pad 76, a second pad 77, a protective film 80, and other components are formed in a region other than the semiconductor unit L. As shown in FIG. 6, similarly to the semiconductor unit L, the first pad 76 and the second pad 77 are exposed to the outside and located away from each other across the semiconductor unit L. The first pad 76 is connected to the third wiring layer 75 and is electrically connected to the third layer 50 via the third wiring layer 75. The second pad 77 is connected to the second wiring layer 73 and is electrically connected to the second layer 30 via the second wiring layer 73. A voltage is supplied to the first pad 76 and the second pad 77 from an external device. The protective film 80 is formed on the irregular surface 31R and the vicinity of the irregular surface 31R to protect the surface of a light-emitting element 100.

After that, singulation into individual regions each including the semiconductor unit L is performed to form a plurality of light-emitting elements 100.

Light-Emitting Element

The light-emitting element manufactured by the manufacturing method according to the present embodiment is described below.

As shown in FIG. 6, the light-emitting element 100 is a light-emitting diode (LED) in which the active layer 40 formed in the semiconductor unit L emits light. For example, the active layer 40 of the light-emitting element 100 emits light through application of a forward voltage to the second layer 30 made of, for example, an n-type semiconductor and the third layer 50 made of, for example, a p-type semiconductor via the second contact 73a and the third electrode 75a. The light emitted from the active layer 40 is mainly extracted through the irregular surface 31R. The light emitted from the active layer 40 is, for example, ultraviolet light. The peak emission wavelength of the light emitted from the active layer 40 is, for example, 410 nm or less. The peak emission wavelength of the light emitted from the active layer 40 is, for example, about 320 nm or more and 410 nm or less. The light emitted from the active layer 40 is partially absorbed by the second layer 30 having the reduced thickness when passing through the second layer 30.

The effects of the present embodiment are described below.

In the method of manufacturing the light-emitting element 100 according to the present embodiment, the first layer 20 made of, for example, GaN is first grown on the substrate 10 made of, for example, sapphire, and the second layer 30 made of, for example, AlGaN is then grown on the first layer 20. In this way, the second layer 30 can be grown with better crystallinity than in the case in which, for example, the first layer 20 and the second layer 30 are grown using AlGaN. The first layer 20 made of GaN is likely to absorb ultraviolet light with a wavelength of, for example, about 365 nm. Accordingly, the light extraction efficiency of the light-emitting element 100 that emits ultraviolet light can be enhanced by removing the first layer 20 after the second layer 30 is formed.

In the present embodiment, the thickness of the first layer 20 is reduced by performing chemical-mechanical polishing from the separated surface 21 side in the steps shown in FIGS. 3 and 4. By this operation, the first layer 20 having the polished surface 22 close to a flat surface can be formed while the thickness of the first layer 20 is efficiently reduced. For example, if the thickness ta3 of the first layer 20 after the step of reducing the thickness of the first layer 20 is 10% or less of the thickness ta2 before the step of reducing the thickness of the first layer 20, the first layer 20 can be even more efficiently reduced in thickness by chemical-mechanical polishing without going beyond the interface F.

The step of performing CMP is performed without going beyond the interface F such that the first layer 20 remains on the second layer 30. In the step of performing CMP, for example, in the case in which the polishing rate P2 when the second layer 30 is polished is higher than the polishing rate P1 of the first layer 20, performing CMP beyond the interface F may cause the second layer 30 to be partially polished too much. The step of performing CMP is stopped before reaching the second layer 30 to leave the first layer 20, so that the second layer 30 is prevented from being partially polished too much.

As shown in FIG. 5, dry etching such as RIE is performed after CMP to remove the first layer 20 from the polished surface 22 side and to reduce the thickness of the second layer 30. The etched surface 31, which is in substantially the same surface condition as of the polished surface 22 before etching, is formed by dry etching. The separated surface 21 is changed to the nearly flat polished surface 22 by CMP, and the etched surface 31 in a similar surface condition to the polished surface 22 is then formed by dry etching of the polished surface 22. This allows for precisely forming the second layer 30 that has small variations in the thickness and is closer to a flat surface. By reducing the thickness of the second layer 30, absorption of light emitted from the active layer 40 by the second layer 30 can be reduced.

In chemical-mechanical polishing and dry etching of the first layer 20 and the second layer 30, the value of the ratio (E2/E1) of the etching rate E2 of the second layer 30 to the etching rate E1 of the first layer 20 is smaller than the value of the ratio (P2/P1) of the polishing rate P2 when the second layer 30 is polished to the polishing rate P1 of the first layer 20. Accordingly, the first layer 20 can be efficiently removed in CMP, and the second layer 30 can be precisely processed in dry etching.

As described above, the present embodiment can improve yield because the first layer 20 and the second layer 30 can be precisely processed.

Test Example

A test example of the method of manufacturing a light-emitting element according to the present embodiment is described below.

First, four samples in each of which the semiconductor structure 1 was grown on the substrate 10 and the substrate 10 was removed were produced by the method described referring to the embodiment. In each sample, the thickness ta2 of the first layer 20 was about 6 μm to 7 μm, the thickness tb2 of the second layer 30 was about 1 μm to 2 μm, and the total thickness of the active layer 40 and the third layer 50 was about 0.3 μm to 0.5 μm.

Figure 7A:
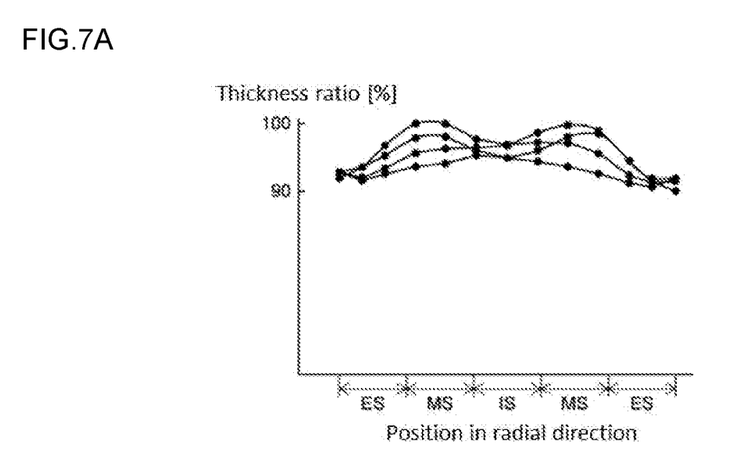
FIG. 7A is a graph showing a thickness distribution in a semiconductor structure before CMP, with position in the radial direction of the semiconductor structure on the horizontal axis and thickness ratio with the maximum thickness being 100% on the vertical axis.

FIG. 7A is a graph showing a thickness distribution in the semiconductor structure 1 before CMP, with position in the radial direction of the semiconductor structure 1 on the horizontal axis and thickness ratio with the maximum thickness being 100 on the vertical axis.

Figure 7B:
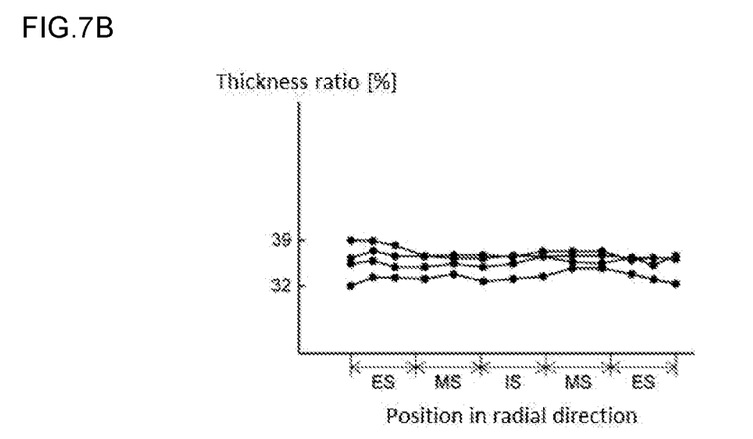
FIG. 7B is a graph showing a thickness distribution in the semiconductor structure after CMP, with position in the radial direction of the semiconductor structure on the horizontal axis and thickness ratio on the vertical axis.

FIG. 7B is a graph showing a thickness distribution in the semiconductor structure 1 after CMP, with position in the radial direction of the semiconductor structure 1 on the horizontal axis and thickness ratio on the vertical axis.

Figure 7C:
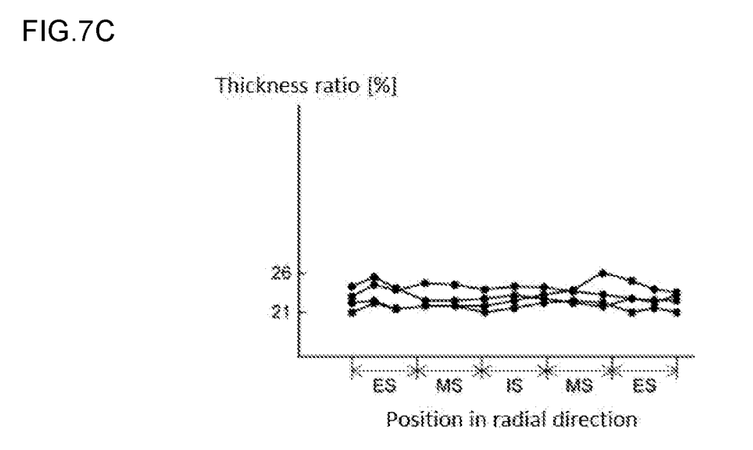
FIG. 7C is a graph showing a thickness distribution in the semiconductor structure after RIE, with position in the radial direction of the semiconductor structure on the horizontal axis and thickness ratio on the vertical axis.

FIG. 7C is a graph showing a thickness distribution in the semiconductor structure 1 after RIE, with position in the radial direction of the semiconductor structure 1 on the horizontal axis and thickness ratio on the vertical axis.

In FIGS. 7A to 7C, the thicknesses measured are expressed as thickness ratios in terms of percentage with the maximum thickness of the semiconductor structure 1 before CMP being 100. FIG. 7A and FIG. 7B show the distributions of the total thickness of the first layer 20, the second layer 30, the active layer 40, and the third layer 50 layered on each other. FIG. 7C shows the distribution of the total thickness of the second layer 30, the active layer 40, and the third layer 50.

As shown in FIG. 7A, the first layer 20 with the separated surface 21 after the substrate 10 was removed had variations in thickness. The thickness reached the maximum in the intermediate region MS, and the thickness reached the minimum at the edge of the edge region ES. The thickness at the edge of the edge region ES was about 90% with the maximum thickness in the intermediate region MS being 100%.

Subsequently, chemical-mechanical polishing was performed such that the thickness of the first layer 20 became about 7% to 8% of the thickness of the first layer 20 before the processing. At this time, the polishing pad was pushed more hardly against a portion of the first layer 20 with a large thickness than against the other portions of the first layer 20. FIG. 7B shows that the variations in the thickness of the first layer 20 having the polished surface 22 became smaller than the variations before chemical-mechanical polishing. The thickness of the first layer 20 having the polished surface 22 was about 39% at the maximum and about 32% at the minimum with the maximum thickness of the first layer 20 having the separated surface 21 in the intermediate region MS being 100%.

Subsequently, dry etching was performed to remove the first layer 20 such that the thickness of the second layer 30 became about 75% of the thickness of the second layer 30 before the processing. Dry etching was performed using an etching gas containing chlorine (Cl). As shown in FIG. 7C, similarly to the state before dry etching, the second layer 30 having the etched surface 31 had smaller variations in thickness than the state before chemical-mechanical polishing. The thickness of the second layer 30 having the etched surface 31 was about 26% at the maximum and about 21% at the minimum with the maximum thickness of the first layer 20 having the separated surface 21 in the intermediate region MS being 100%.

In the test example described above, the four samples were each able to be processed with the variations in the thickness of the second layer 30 having the etched surface 31 being small. The variations in the thickness of the second layer 30 were able to be reduced by reducing the variations in the thickness of the first layer 20 by chemical-mechanical polishing, and in subsequent dry etching by etching the second layer 30 while removing the first layer 20.

Comparative Examples

Comparative Example 1 in which only chemical-mechanical polishing was performed to remove the first layer 20 and reduce the thickness of the second layer 30 and Comparative Example 2 in which only dry etching was performed to remove the first layer 20 and reduce the thickness of the second layer 30 are described below.

Figure 8A:
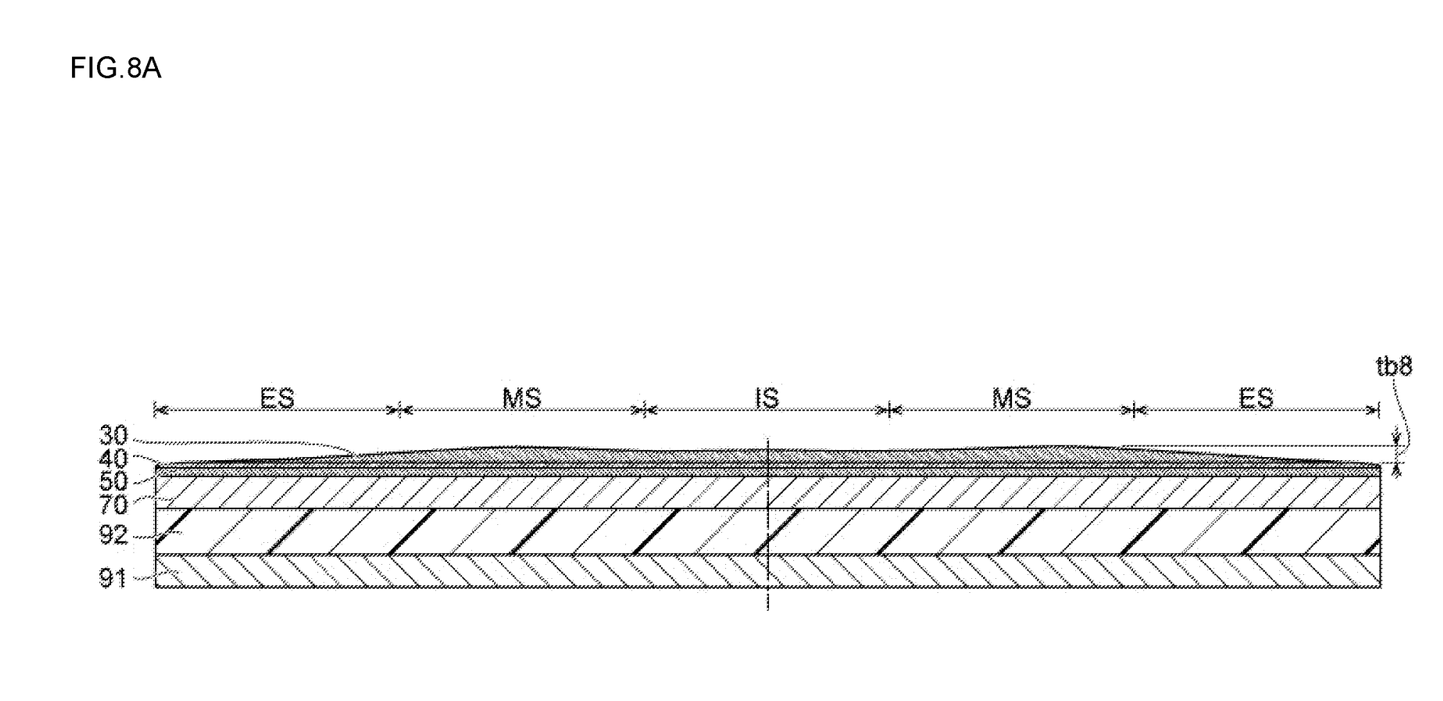
FIG. 8A is a schematic cross-sectional view illustrating a method of manufacturing a light-emitting element of Comparative Example 1.

FIG. 8A is a schematic cross-sectional view illustrating a method of manufacturing a light-emitting element of Comparative Example 1.

Figure 8B:
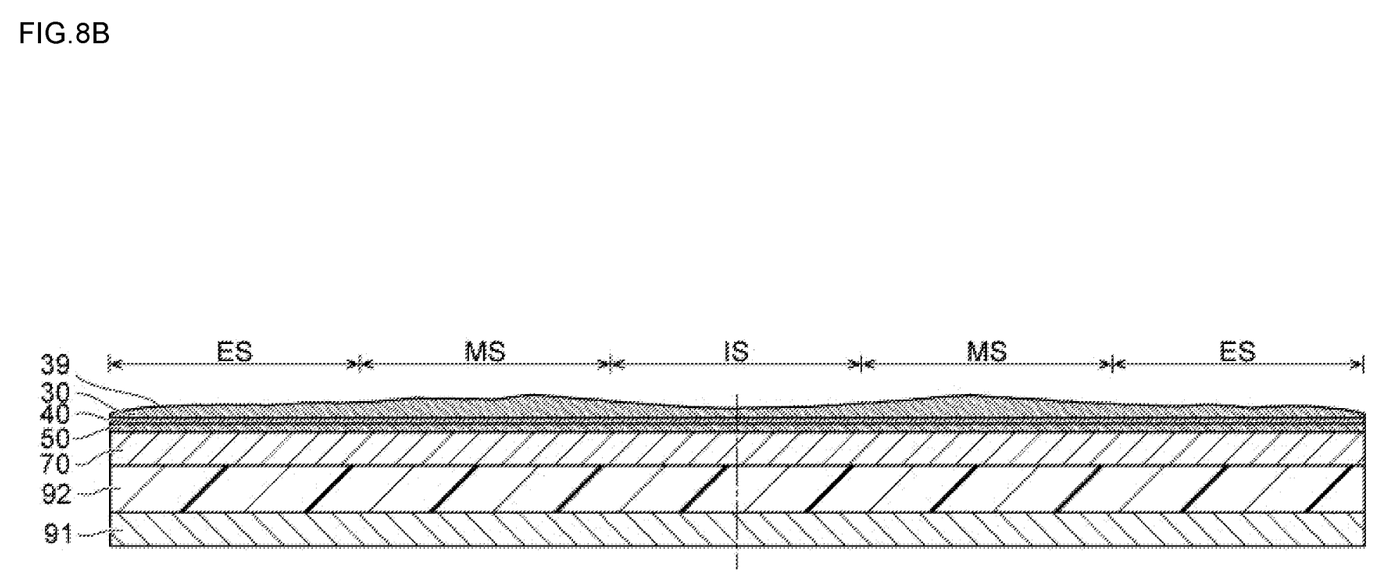
FIG. 8B is a schematic cross-sectional view illustrating a method of manufacturing a light-emitting element of Comparative Example 2.

FIG. 8B is a schematic cross-sectional view illustrating a method of manufacturing a light-emitting element of Comparative Example 2.

In Comparative Example 1, only chemical-mechanical polishing was performed to remove the first layer 20 and reduce the thickness of the second layer 30. In this case, chemical-mechanical polishing was performed beyond the interface F between the first layer 20 and the second layer 30. For example, in a portion in which the second layer 30 was exposed first in chemical-mechanical polishing, the second layer 30 was removed at the polishing rate P2, which was twice as high as the polishing rate P1 of the first layer 20. On the other hand, in a portion in which the second layer 30 was exposed last in chemical-mechanical polishing, the amount of the second layer 30 to be removed was small because the polishing time was shorter than the polishing time of the portion of the second layer 30 that had been exposed first. Accordingly, the second layer 30 was likely to be partially removed too much in the step of performing chemical-mechanical polishing, leading to variations in the thickness of the second layer 30 after chemical-mechanical polishing.

In the case in which chemical-mechanical polishing was performed on the separated surface 21 of the first layer 20 having variations in thickness as shown in FIG. 3, for example, at the edge of the edge region ES having the minimum thickness before the processing, the second layer 30 was exposed first, and too much of the second layer 30 was removed as shown in FIG. 8A. For example, in a portion of the intermediate region MS having the maximum thickness before the processing, the second layer 30 was exposed last, and the amount of the second layer 30 to be removed was smaller than the removed amount of the portion of the second layer 30 exposed first. Accordingly, the thickness of the second layer 30 after chemical-mechanical polishing differs between the edge region ES and the intermediate region MS. In Comparative Example 1, the second layer 30 was likely to have variations in thickness, and yield may be reduced.

Also when variations in the thickness of the first layer 20 were reduced by increasing the pushing force applied to the intermediate region MS in chemical-mechanical polishing, it was difficult to perform chemical-mechanical polishing on the second layer 30 at the same time. Accordingly, the length of time that chemical-mechanical polishing was performed on the surface of the second layer 30 varies, and the thickness of the second layer 30 therefore varies.

In Comparative Example 2, only dry etching was performed from the first layer 20 to the second layer 30 to reduce the thickness of the second layer 30. In the processing by dry etching, the thickness distribution of the first layer 20 before dry etching tends to be retained. Substantially the same thickness distribution as of the first layer 20 before processing as shown in FIG. 3 is therefore observed as the thickness distribution of the second layer 30 having an etched surface 39 after processing as shown in FIG. 8B. Accordingly, in Comparative Example 2, the second layer 30 cannot be efficiently processed, and it was difficult to reduce variations in the thickness of the second layer 30.

In contrast to Comparative Examples 1 and 2, in the method of manufacturing the light-emitting element 100 according to the present embodiment, the first layer 20 can be efficiently removed, and variations in the thickness of the second layer 30 can be reduced in the step of reducing the thickness of the second layer 30. Accordingly, the light-emitting element 100 can be manufactured with a good yield.

What is claimed is:
1. A method of manufacturing a light-emitting element, the method comprising:
  providing a semiconductor structure comprising:
    a first layer containing gallium and nitrogen,
    a second layer of a first conductive type, the second layer containing gallium, aluminum, and nitrogen and being located on or above the first layer, an active layer located on or above the second layer, and a third layer of a second conductive type, the third layer located on or above the active layer, wherein a thickness of the first layer is larger than a thickness of the second layer;

performing chemical-mechanical polishing from a first layer side to reduce the thickness of the first layer; and performing dry etching from the first layer side to remove the first layer and reduce the thickness of the second layer.

2. The method of manufacturing a light-emitting element according to claim 1, wherein the thickness of the first layer after the step of performing chemical-mechanical polishing is 20% or less of the thickness of the first layer before the step of performing chemical-mechanical polishing.

3. The method of manufacturing a light-emitting element according to claim 1, wherein the dry etching comprises reactive ion etching using an etching gas containing chlorine.

4. The method of manufacturing a light-emitting element according to claim 2, wherein the dry etching comprises reactive ion etching using an etching gas containing chlorine.

5. The method of manufacturing a light-emitting element according to claim 1, wherein the step of providing a semiconductor structure comprises:

forming the first layer, the second layer, the active layer, and the third layer on a substrate; and removing the substrate from the first layer.

6. The method of manufacturing a light-emitting element according to claim 2, wherein the step of providing a semiconductor structure comprises:

forming the first layer, the second layer, the active layer, and the third layer on a substrate; and removing the substrate from the first layer.

7. The method of manufacturing a light-emitting element according to claim 3, wherein the step of providing a semiconductor structure comprises:

forming the first layer, the second layer, the active layer, and the third layer on a substrate; and removing the substrate from the first layer.

8. The method of manufacturing a light-emitting element according to claim 1, wherein the first layer is made of GaN.

9. The method of manufacturing a light-emitting element according to claim 2, wherein the first layer is made of GaN.

10. The method of manufacturing a light-emitting element according to claim 1, wherein the second layer is made of AlGaN.

11. The method of manufacturing a light-emitting element according to claim 2, wherein the second layer is made of AlGaN.

12. The method of manufacturing a light-emitting element according to claim 1, wherein a peak emission wavelength of light from the active layer is 410 nm or less.

13. The method of manufacturing a light-emitting element according to claim 2, wherein a peak emission wavelength of light from the active layer is 410 nm or less.

14. The method of manufacturing a light-emitting element according to claim 1, wherein, in the step of providing the semiconductor structure, a thickness of the first layer is 5 μm or more and 15 μm or less.

15. The method of manufacturing a light-emitting element according to claim 2, wherein, in the step of providing the semiconductor structure, a thickness of the first layer is 5 μm or more and 15 μm or less.

16. The method of manufacturing a light-emitting element according to claim 9, wherein, in the step of providing the semiconductor structure, a thickness of the first layer is 5 μm or more and 15 μm or less.

17. The method of manufacturing a light-emitting element according to claim 1, wherein, in the step of providing the semiconductor structure, a thickness of the second layer is 1 μm or more and 3 μm or less.

18. The method of manufacturing a light-emitting element according to claim 2, wherein, in the step of providing the semiconductor structure, a thickness of the second layer is 1 μm or more and 3 μm or less.

19. The method of manufacturing a light-emitting element according to claim 11, wherein, in the step of providing the semiconductor structure, a thickness of the second layer is 1 μm or more and 3 μm or less.

20. The method of manufacturing a light-emitting element according to claim 1, wherein a value of a ratio of an etch rate of the second layer in the step of performing dry etching to an etch rate of the first layer in the step of performing dry etching is smaller than a value of a ratio of a polishing rate of a material of the second layer when subjected to chemical-mechanical polishing under same conditions as in the step of performing chemical-mechanical polishing to a polishing rate of the first layer in the step of performing chemical-mechanical polishing.

* * * * *